(12) United States Patent
Tabata et al.

(10) Patent No.: US 10,297,538 B2
(45) Date of Patent: May 21, 2019

(54) SIGNAL TRANSMISSION APPARATUS INCLUDING SEMICONDUCTOR CHIPS AND SIGNAL ISOLATOR

(71) Applicant: Panasonic Corporation, Osaka (JP)

(72) Inventors: Osamu Tabata, Osaka (JP); Shuichi Nagai, Osaka (JP); Songbaek Choe, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/497,189

(22) Filed: Apr. 25, 2017

(65) Prior Publication Data
US 2017/0330824 A1    Nov. 16, 2017

(30) Foreign Application Priority Data

May 13, 2016    (JP) .................................. 2016-097468

(51) Int. Cl.
*H01L 23/495*    (2006.01)
*H01F 38/14*    (2006.01)
(Continued)

(52) U.S. Cl.
CPC ....... *H01L 23/49575* (2013.01); *H01F 38/14* (2013.01); *H01L 23/49* (2013.01); *H01L 23/495* (2013.01); *H01L 23/49541* (2013.01); *H01L 23/5227* (2013.01); *H01L 25/00* (2013.01); *H01P 1/201* (2013.01); *H01P 1/20345* (2013.01); *H01P 5/028* (2013.01); *H04B 5/0025* (2013.01); *H04B 5/0093* (2013.01);
(Continued)

(58) Field of Classification Search
CPC . H01L 2224/48247; H01L 2224/73265; H01L 2224/49171; H01L 2224/04042; H01L 2924/0665; H01L 2924/3025; H01L 23/645; H01L 23/49575; H01L 23/5227; H01L 23/48; H01L 23/49537; H01L 23/495; H01L 23/49541; H01L 25/00; H01L 23/49582; H04B 5/0093
See application file for complete search history.

(56) References Cited

U.S. PATENT DOCUMENTS

2003/0001244 A1 *  1/2003  Araki .................... H01L 21/568
                                                                257/666
2008/0061631 A1    3/2008  Fouquet et al.
(Continued)

FOREIGN PATENT DOCUMENTS

JP    2008-061236    3/2008
JP    2010-226343    10/2010
(Continued)

*Primary Examiner* — Khiem D Nguyen
(74) *Attorney, Agent, or Firm* — McDermott Will & Emery LLP

(57) ABSTRACT

A signal transmission apparatus includes: a first lead frame; a second lead frame spaced from the first lead frame; a primary semiconductor chip electrically connected to the first lead frame; a secondary semiconductor chip electrically connected to the second lead frame; and a signal isolator through which a signal is isolatedly transmitted from the primary semiconductor chip to the secondary semiconductor chip, the signal isolator having a first main surface that is bonded to both the first lead frame and the second lead frame.

16 Claims, 12 Drawing Sheets

(51) Int. Cl.
    *H01L 23/522*      (2006.01)
    *H01L 25/00*      (2006.01)
    *H01P 1/201*      (2006.01)
    *H01P 5/02*      (2006.01)
    *H04B 5/00*      (2006.01)
    *H01L 23/49*      (2006.01)
    *H01P 1/203*      (2006.01)
    *H01L 21/56*      (2006.01)
    *H01P 7/08*      (2006.01)
    *H01L 23/48*      (2006.01)

(52) U.S. Cl.
    CPC ............ *H01L 21/565* (2013.01); *H01L 23/48* (2013.01); *H01L 23/49551* (2013.01); *H01L 2224/2919* (2013.01); *H01L 2224/32245* (2013.01); *H01L 2224/48091* (2013.01); *H01L 2224/48137* (2013.01); *H01L 2224/48145* (2013.01); *H01L 2224/48247* (2013.01); *H01L 2224/49109* (2013.01); *H01L 2224/49171* (2013.01); *H01L 2224/49175* (2013.01); *H01L 2224/49177* (2013.01); *H01L 2224/73265* (2013.01); *H01L 2924/01079* (2013.01); *H01P 7/08* (2013.01)

(56) References Cited

U.S. PATENT DOCUMENTS

| | | | | |
|---|---|---|---|---|
| 2008/0284552 | A1* | 11/2008 | Lim | H01F 17/0006 336/200 |
| 2009/0243783 | A1* | 10/2009 | Fouquet | H01F 19/08 336/200 |
| 2010/0020448 | A1 | 1/2010 | Ng et al. | |
| 2010/0127369 | A1* | 5/2010 | Seki | H01L 21/4821 257/676 |
| 2010/0259909 | A1* | 10/2010 | Ho | H01F 19/08 361/767 |
| 2013/0127033 | A1* | 5/2013 | Nakashiba | H01L 23/48 257/676 |
| 2013/0147580 | A1* | 6/2013 | Nagai | H01P 1/2013 333/204 |
| 2013/0187477 | A1* | 7/2013 | Nagai | H01P 1/20381 307/104 |
| 2013/0323885 | A1* | 12/2013 | Chun | H01L 21/56 438/123 |
| 2015/0004902 | A1* | 1/2015 | Pigott | H01L 28/10 455/41.1 |

FOREIGN PATENT DOCUMENTS

| | | |
|---|---|---|
| JP | 2010-283817 | 12/2010 |
| JP | 2015-012614 | 1/2015 |

\* cited by examiner

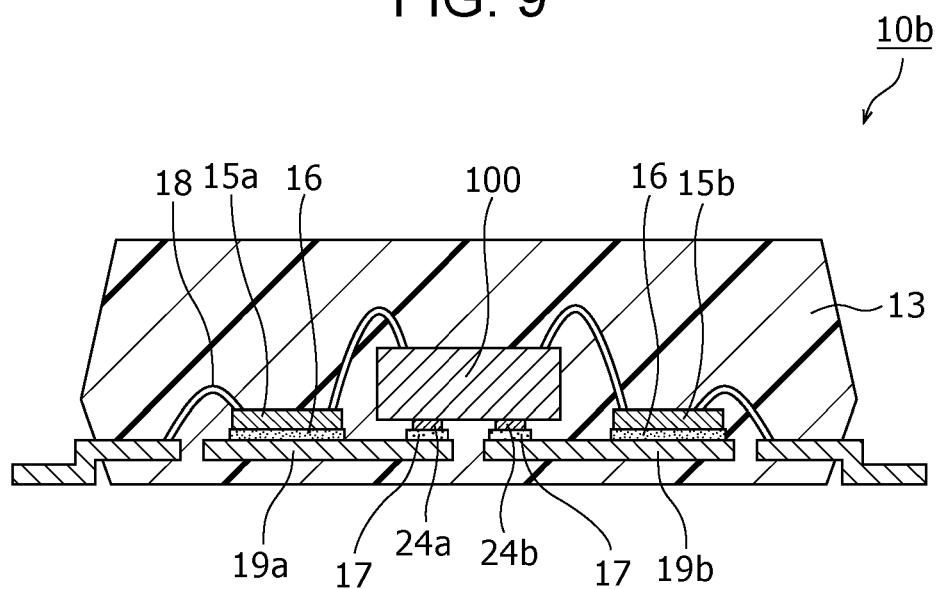

SIGNAL TRANSMISSION APPARATUS INCLUDING SEMICONDUCTOR CHIPS AND SIGNAL ISOLATOR

BACKGROUND

1. Technical Field

The present disclosure relates to a signal transmission apparatus.

2. Description of the Related Art

An isolator including an input lead frame and an output lead frame under a substrate and a coil transducer is disclosed (see, for example, Japanese Patent No. 5456583).

SUMMARY

In one general aspect, the techniques disclosed here feature a signal transmission apparatus including: a first lead frame; a second lead frame spaced from the first lead frame; a primary semiconductor chip electrically connected to the first lead frame; a secondary semiconductor chip electrically connected to the second lead frame; and a signal isolator through which a signal is isolatedly transmitted from the primary semiconductor chip to the secondary semiconductor chip, the signal isolator having a first main surface that is bonded to both the first lead frame and the second lead frame.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 9 is a cross-sectional view illustrating a signal transmission apparatus according to a second modification of the first embodiment;

DETAILED DESCRIPTION

Underlying Knowledge Forming Basis of the Present Disclosure

The inventors' viewpoints will be described below.

Contactless transmission technologies for transmitting signals while ensuring electrical isolation between circuits are in demand in various electronic devices. For example, when a high-voltage circuit and a low-voltage circuit are operated, a ground loop between the circuits with different ground potentials is cut off in order to prevent malfunction or failures of the low-voltage circuit. In doing so, application of an excessive voltage from the high-voltage circuit to the low-voltage circuit can be prevented when the high-voltage circuit and the low-voltage circuit are connected.

An example of a signal transmission apparatus where electrical isolation is ensured is gate driver large-scale integration (LSI) supplying electric power to a gate terminal of a power semiconductor device. In a power circuit system for motor driving or power control, which includes the above-described signal transmission apparatus and power semiconductor device, the signal transmission apparatus is desired to have a small and high-heat-dissipation package structure in order to satisfy the demand for reducing the overall size of the power circuit system.

Figure 1:
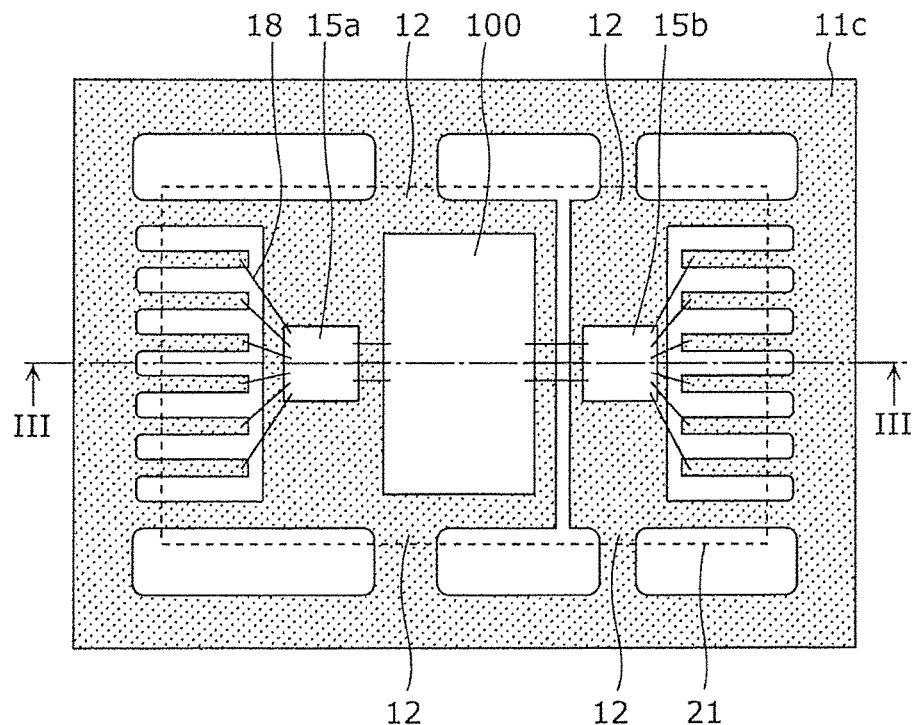
FIG. 1 is a top view illustrating a signal transmission apparatus before being sealed with resin according to a first comparative example.
Figure 2:
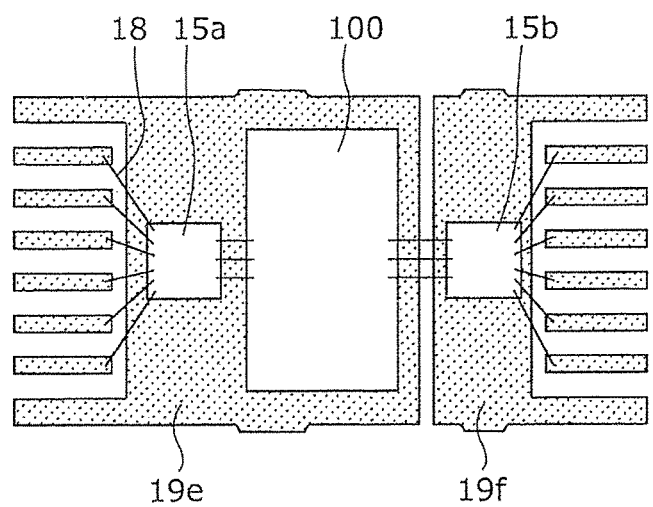
FIG. 2 is a top view illustrating the configuration of the signal transmission apparatus in which a lead frame sheet is cut along a cutting line in the first comparative example.
Figure 3:
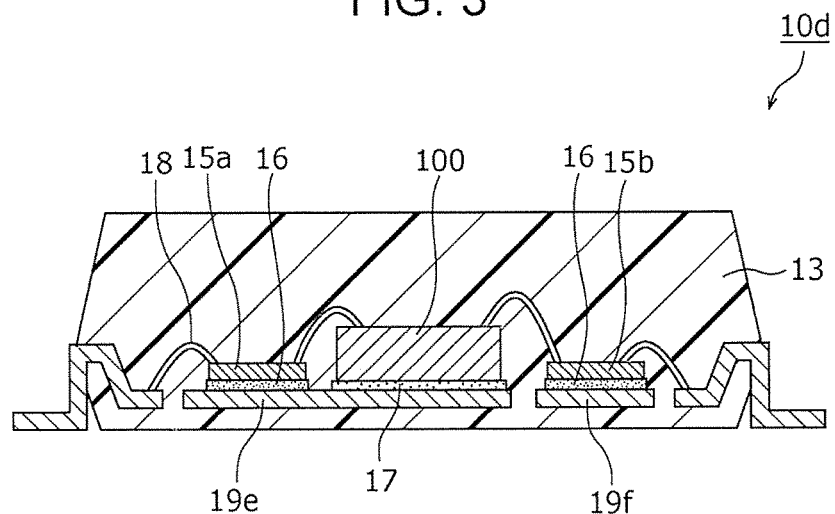
FIG. 3 is a cross-sectional view illustrating the signal transmission apparatus cut along broken line III-III of FIG. 1.

Using FIGS. 1 to 4, a signal transmission apparatus of the related art will be described. FIG. 1 is a top view illustrating a signal transmission apparatus 10d before being sealed with resin according to a first comparative example. FIG. 2 is a top view illustrating the configuration of the signal transmission apparatus 10d in which a lead frame sheet is cut along a cutting line 21 in the first comparative example. FIG. 3 is a cross-sectional view of the signal transmission apparatus 10d cut along broken line III-III of FIG. 1.

In the following description, the term "thickness" refers to a length in the vertical direction with respect to a first main surface of the signal transmission apparatus and/or a main surface of a circuit substrate on which the signal transmission apparatus is mounted. In the following description, the terms "top surface", "bottom surface", "above", and "below" are used for the sake of description, and do not necessarily limit the relative positions. These terms are exchangeable in appropriate conditions, and various embodiments of the present disclosure are also operable in orientations other than those described or illustrated here.

At first, a process of manufacturing the signal transmission apparatus 10d will be described. An electromagnetic resonance coupler 100, a transmission circuit chip 15a, and a reception circuit chip 15b are mounted on a main surface of a lead frame sheet 11c. As illustrated in FIG. 1, the lead frame sheet 11c includes one or more lead frames. The transmission circuit chip 15a and the reception circuit chip 15b are electrically connected by wires 18 to the electromagnetic resonance coupler 100. Thereafter, the electromagnetic resonance coupler 100, the transmission circuit chip 15a, and the reception circuit chip 15b are sealed with mold resin 13 and packaged. Thereafter, the lead frame sheet 11c is cut along the cutting line 21, thereby obtaining a first lead frame 19e and a second lead frame 19f, as illustrated in FIG. 2. The main surface of a lead frame is a surface on which the electromagnetic resonance coupler 100 is mounted and is a surface parallel to the main surface of a circuit substrate on which the signal transmission apparatus 10d is mounted.

To prevent curling caused by resin sealing using the mold resin 13, the first lead frame 19e and the second lead frame 19f are fixed in the lead frame sheet 11c at the time of being molded. The thickness of the mold resin 13 provided below the electromagnetic resonance coupler 100 is desired to be as thin as possible in order to lower the heat resistance and to increase the heat dissipation.

While being fixed with the use of suspension leads 12, the first lead frame 19e and the second lead frame 19f are sealed with resin. The area of the first lead frame 19e or the second lead frame 19f may increase in accordance with the size of the transmission circuit chip 15a, the reception circuit chip 15b, or the electromagnetic resonance coupler 100. Alternatively, the first lead frame 19e and the second lead frame 19f may have greatly different areas. In the above-described two cases, the suspension leads 12 are designed to be firm and wide in order to prevent curling of the first lead frame 19e and the second lead frame 19f caused by resin sealing.

However, when the suspension leads 12 are firm and wide, the cutting stress at the time of cutting the lead frame sheet 11c becomes great, which may result in interfacial pealing and/or resin crack between the mold resin 13 and the suspension leads 12. As a result, the reliability such as moisture resistance of the signal transmission apparatus 10d may be lowered.

When the thickness of the electromagnetic resonance coupler 100 is great, the thickness of a portion of the mold resin 13 that is positioned above each lead frame becomes greatly different from the thickness of a portion of the mold resin 13 that is positioned below each lead frame. Therefore, a portion below the signal transmission apparatus 10d may not be sufficiently filled with the mold resin 13. In this case, the isolation of the signal transmission apparatus 10d may deteriorate, and the interface of an end portion of the first lead frame 19e or the second lead frame 19f with the mold resin 13 may peal off.

Figure 4:
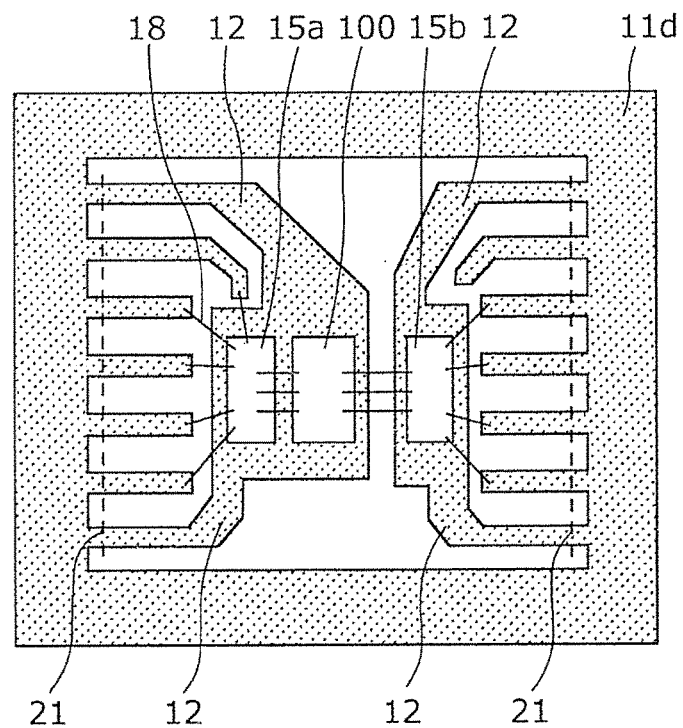
FIG. 4 is a top view illustrating a signal transmission apparatus before being sealed with resin according to a second comparative example.

The suspension leads 12 may be also used as terminals. FIG. 4 is a top view illustrating a signal transmission apparatus before being sealed with resin according to such a second comparative example.

As illustrated in FIG. 4, a lead frame sheet 11d has leads serving as ground (GND) terminals, which are also used as the suspension leads 12. When the leads serving as GND terminals are also used as the suspension leads 12, the number of GND terminals of the lead frame sheet 11d increases. It thus becomes difficult to reduce the size of the signal transmission apparatus. To reduce the size of the signal transmission apparatus, the number of terminals excluding the GND terminals that are used also as the suspension leads 12 is limited. A lead is a portion used to connect the signal transmission apparatus to an external component and/or circuit through metal wiring or the like after the lead frame sheet 11d is cut along the cutting line 21.

On the basis of the above viewpoints, the inventors have conceived the configuration of the present disclosure.

A signal transmission apparatus according to an aspect of the present disclosure includes a first lead frame; a second lead frame spaced from the first lead frame; a primary semiconductor chip that is electrically connected to the first lead frame and that transmits a transmission signal; a secondary semiconductor chip that is electrically connected to the second lead frame and that receives the transmission signal; and an isolation device that contactlessly transmits the transmission signal, transmitted from the primary semiconductor chip, to the secondary semiconductor chip. The isolation device includes a primary isolation device and a secondary isolation device. The primary isolation device is electrically connected to the primary semiconductor chip, and contactlessly transmits the transmission signal, transmitted from the primary semiconductor chip, to the secondary isolation device. The secondary isolation device is electrically connected to the secondary semiconductor chip, and transmits the contactlessly-transmitted transmission signal to the secondary semiconductor chip. The isolation device has a bonding surface bonded to both the first lead frame and the second lead frame.

The bonding surface of the isolation device may include a first pad for bonding the isolation device and the first lead frame, and a second pad for bonding the isolation device and the second lead frame.

The first pad may be formed of metal and may be bonded with an adhesive to the first lead frame. The second pad may be formed of metal and may be bonded with an adhesive to the second lead frame.

The primary semiconductor chip may be a transmission circuit chip. The secondary semiconductor chip may be a reception circuit chip. The isolation device may be an electromagnetic resonance coupler.

A first side surface of the isolation device that intersects the bonding surface may be provided with a first recess leading to a space between the first lead frame and the second lead frame.

The primary isolation device and the secondary isolation device may be arranged so as to face each other in a direction that intersects the bonding surface, and the primary isolation device and the secondary isolation device may be bent along the first recess.

A second side surface of the isolation device that is opposite to the first side surface may be provided with a second recess leading to the space, and the primary isolation device and the secondary isolation device may be bent along the first recess and the second recess.

The cross-sectional shape of at least one of the first recess and the second recess may be U-shaped or arc-shaped.

The primary semiconductor chip may be bonded to the first lead frame, and the secondary semiconductor chip may be bonded to the second lead frame.

The primary semiconductor chip may be bonded to the first lead frame, and the secondary semiconductor chip may be bonded to a surface of the isolation device that is opposite to the bonding surface.

The primary semiconductor chip may be bonded to a surface of the isolation device that is opposite to the bonding surface, and the secondary semiconductor chip may be bonded to the second lead frame.

The signal transmission apparatus may further include mold resin, and the primary semiconductor chip, the secondary semiconductor chip, and the isolation device may be sealed with the mold resin.

Hereinafter, embodiments will be specifically described with reference to the drawings.

All of embodiments described below indicate comprehensive or specific examples. Numerical values, shapes, materials, elements, the positions and connection configuration of elements, steps, the order of steps, and so forth indicated in the following embodiments are only exemplary and are not construed to limit the present disclosure. Among the elements in the following embodiments, elements that are not defined in an independent claim indicating the broadest concept are described as arbitrary elements. The drawings are only schematic diagrams and are not necessarily strictly illustrated. In the drawings, substantially the same configurations are given the same reference numeral, and overlapping descriptions may be omitted or simplified.

First Embodiment

Hereinafter, a first embodiment will be described using FIGS. 5 to 7B.

Figure 5:
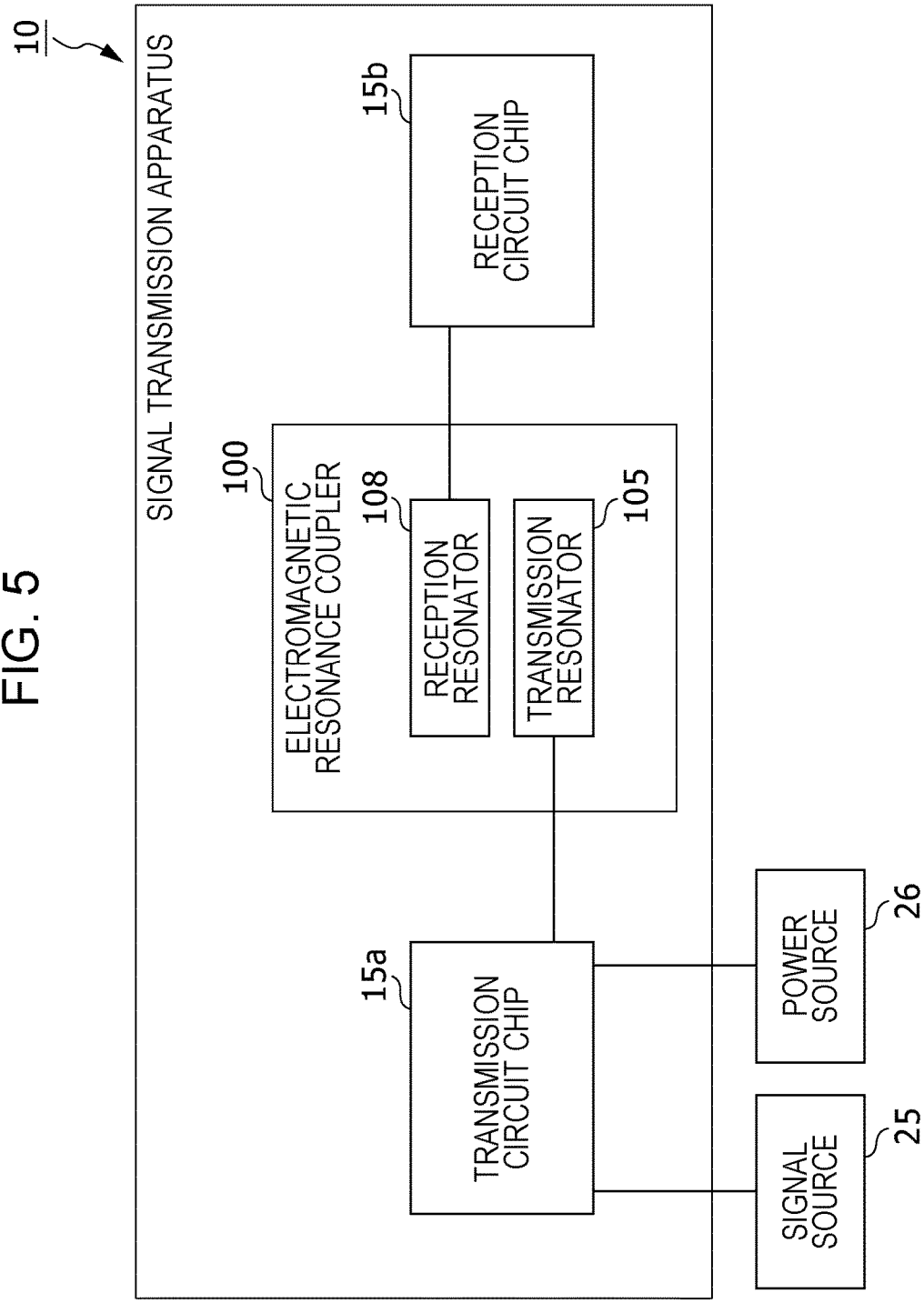
FIG. 5 is a block diagram illustrating the configuration of a signal transmission apparatus according to a first embodiment.

FIG. 5 is a block diagram illustrating the system configuration of a signal transmission apparatus 10 according to the first embodiment.

As illustrated in FIG. 5, the signal transmission apparatus 10 includes the transmission circuit chip 15a, the reception circuit chip 15b, and the electromagnetic resonance coupler 100.

The signal transmission apparatus 10 is a semiconductor apparatus of a resin package type using one or more lead frames. The signal transmission apparatus 10 contactlessly transmits signals while ensuring isolation using an isolation device.

The electromagnetic resonance coupler 100 includes a transmission resonator 105 and a reception resonator 108. The electromagnetic resonance coupler 100 is an example of a "signal isolator" of the present disclosure. The signal isolator may be referred to as an isolation device. The transmission resonator 105 is an example of a "transmission part" of the present disclosure, and the reception resonator 108 is an example of a "reception part" of the present disclosure. The transmission part may be referred to as a primary isolation device, and the reception part may be referred to as a secondary isolation device.

The electromagnetic resonance coupler 100 can transmit electric power and signals while ensuring isolation between a transmission side and a reception side by using a resonance phenomenon based on LC resonance, which occurs between the transmission resonator 105 and the reception resonator 108.

The transmission circuit chip 15a is an example of a "primary semiconductor chip" of the present disclosure. The transmission circuit chip 15a obtains electric power supplied from a power source 26 and an input signal supplied from a signal source 25. The transmission circuit chip 15a includes a modulation circuit. The modulation circuit modulates radio-frequency (RF) waves in accordance with the input signal to generate a transmission signal, and transmits the transmission signal to the transmission resonator 105 of the electromagnetic resonance coupler 100. The frequency of the RF waves is higher than the frequency of the input signal. The transmission circuit chip 15a is, for example, a semiconductor chip including a transmission circuit. Note that the transmission circuit chip 15a may include an RF generator that generates RF waves or may obtain RF waves from the outside.

The frequency band of RF waves in the present disclosure is, for example, the microwave band (including the millimeterwave band). The frequency of RF waves ranges from, for example, 2.4 GHz to 5.8 GHz (inclusive), but is not particularly limited to this range. The electromagnetic resonance coupler 100 can transmit RF waves with very high frequencies, compared with a magnetic-coupling isolator using a transformer.

The transmission resonator 105 receives a transmission signal from the transmission circuit chip 15a, and contactlessly transmits this transmission signal to the reception resonator 108. The reception resonator 108 receives the transmission signal from the transmission resonator 105, and transmits the transmission signal to the reception circuit chip 15b.

The reception circuit chip 15b is, for example, an example of a "secondary semiconductor chip" of the present disclosure. The reception circuit chip 15b includes a rectifier circuit. The rectifier circuit rectifies the transmission signal received by the reception resonator 108 of the electromagnetic resonance coupler 100, and generates an output signal corresponding to the input signal. The reception circuit chip 15b is, for example, a semiconductor chip including a reception circuit.

Figure 6A:
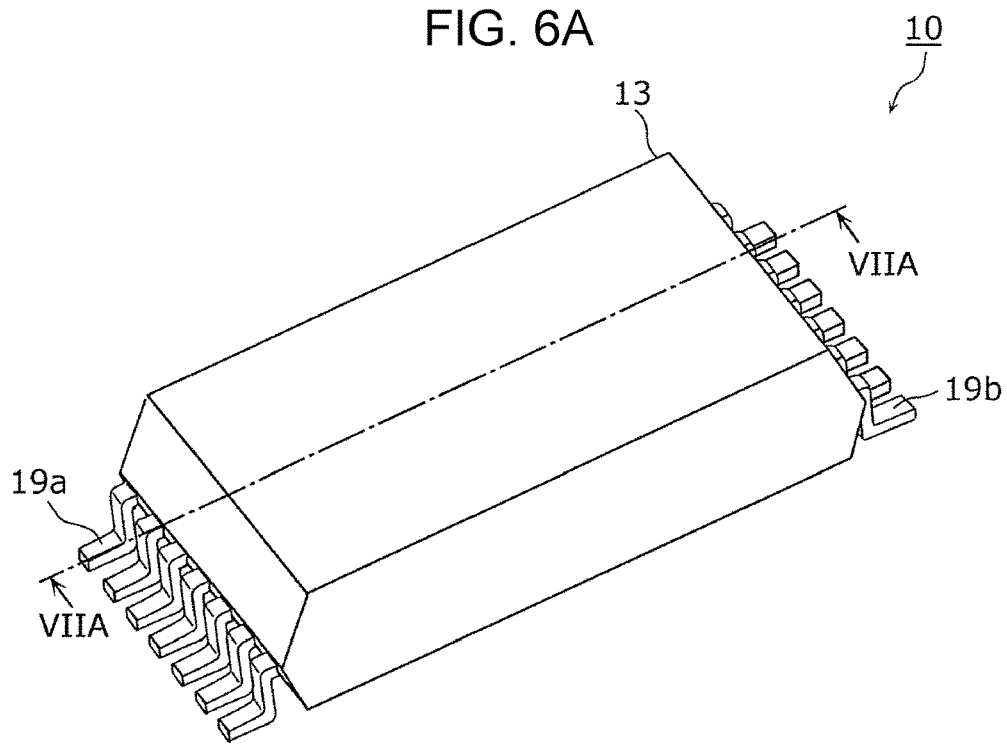
FIG. 6A is a perspective view illustrating the signal transmission apparatus according to the first embodiment.
Figure 6B:
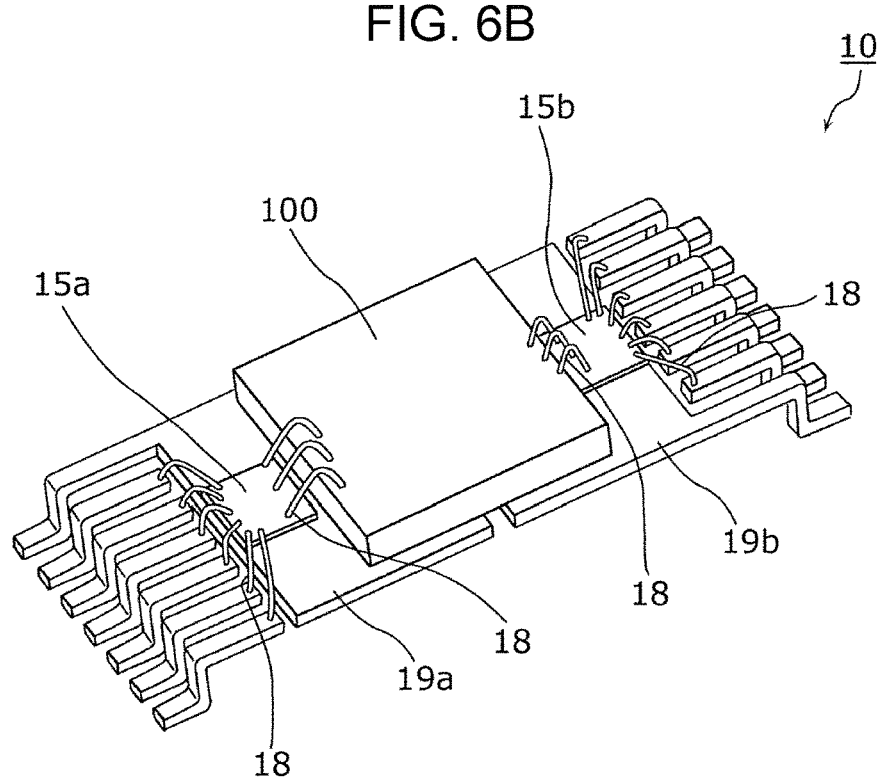
FIG. 6B is a perspective view illustrating the internal configuration of the signal transmission apparatus according to the first embodiment.
Figure 7A:
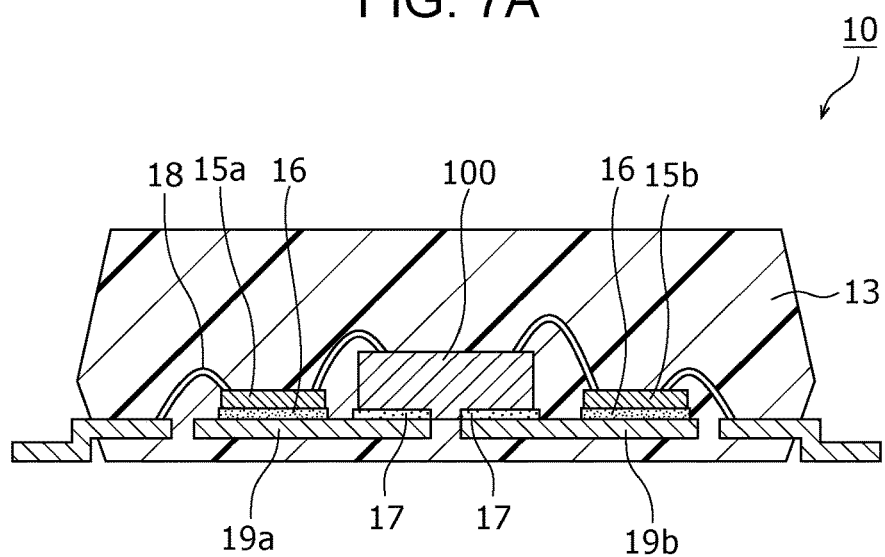
FIG. 7A is a cross-sectional view illustrating the signal transmission apparatus cut along broken line VIIA-VIIA of FIG. 6A.
Figure 7B:
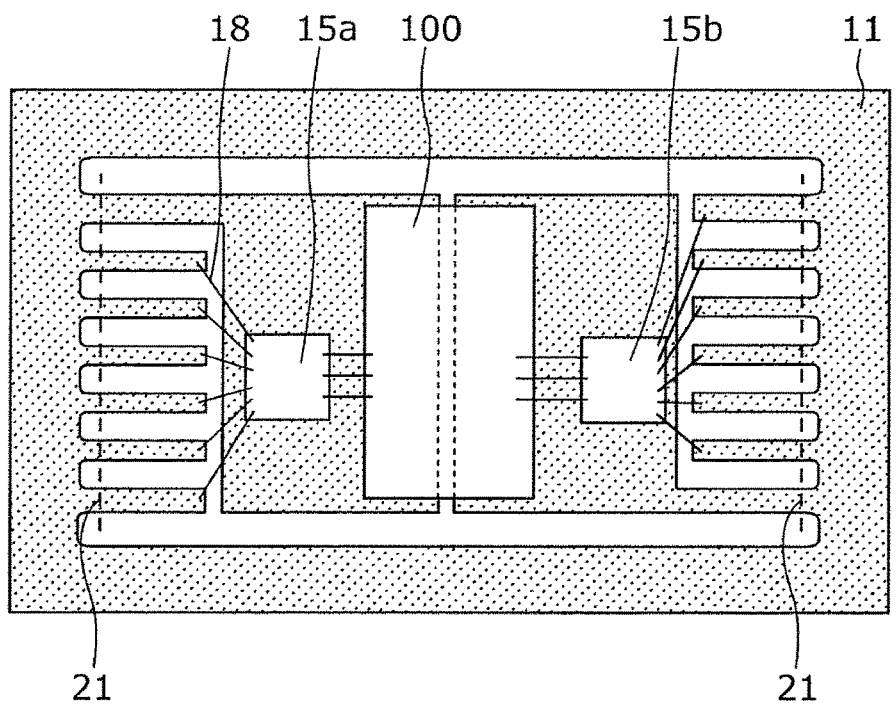
FIG. 7B is a top view illustrating the signal transmission apparatus before being sealed with resin according to the first embodiment.

FIG. 6A is a perspective view of the signal transmission apparatus 10. FIG. 6B is a perspective view illustrating the internal configuration of the signal transmission apparatus 10. FIG. 7A is a cross-sectional view of the signal transmission apparatus 10 cut along broken line VIIA-VIIA of FIG. 6A. FIG. 7B is a top view illustrating the signal transmission apparatus 10 before being sealed with resin. Although FIG. 7B is not a cross-sectional view, a lead frame sheet 11 is hatched in order to make the illustration easier to understand.

As illustrated in FIGS. 6A to 7B, the signal transmission apparatus 10 includes a first lead frame 19a and a second lead frame 19b. The signal transmission apparatus 10 includes the transmission circuit chip 15a, the reception circuit chip 15b, an adhesive 16, the electromagnetic resonance coupler 100, an adhesive 17, the wires 18, and the mold resin 13.

As illustrated in FIG. 7B, after the electromagnetic resonance coupler 100, the transmission circuit chip 15a, and the reception circuit chip 15b are mounted on the lead frame sheet 11, the lead frame sheet 11 is put into a molding mold and sealed with resin. Thereafter, the lead frame sheet 11, which has been sealed with resin, is cut along the cutting line 21. By bending the leads, the signal transmission apparatus 10 is obtained. Note that the lead frame sheet 11 is a metal plate.

The first lead frame 19a is a lead frame to which the transmission circuit chip 15a is electrically connected. The transmission circuit chip 15a is bonded with the adhesive 16 to a main surface of the first lead frame 19a.

The second lead frame 19b is a lead frame to which the reception circuit chip 15b is electrically connected. The reception circuit chip 15b is bonded with the adhesive 16 to a main surface of the second lead frame 19b.

The first lead frame 19a and the second lead frame 19b are arranged with a space therebetween.

A transmission signal is contactlessly transmitted from the transmission circuit chip 15a to the reception circuit chip 15b via the electromagnetic resonance coupler 100. The electromagnetic resonance coupler 100 has a main surface. The main surface of the electromagnetic resonance coupler 100 is bonded to both the main surface of the first lead frame 19a and the main surface of the second lead frame 19b using the adhesive 17. In other words, the main surface (i.e., first main surface) of the electromagnetic resonance coupler 100 includes a first bonding area where the electromagnetic resonance coupler 100 is bonded to the first lead frame 19a, and a second bonding area where the electromagnetic resonance coupler 100 is bonded to the second lead frame 19b. When the first main surface is a plane, the electromagnetic resonance coupler 100 is bonded in the same plane to the first lead frame 19a and the second lead frame 19b.

The electromagnetic resonance coupler 100 is electrically connected by the wires 18 to the transmission circuit chip 15a and the reception circuit chip 15b. The transmission circuit chip 15a is electrically connected by the wires 18 to the leads of the first lead frame 19a. The reception circuit chip 15b is electrically connected by the wires 18 to the leads of the second lead frame 19b.

The adhesive 17 is used for bonding the bottom surface of the electromagnetic resonance coupler 100 to the first lead frame 19a and the second lead frame 19b. Although not particularly limited, the adhesive 17 is, for example, an epoxy adhesive or a Ag paste.

The transmission circuit chip 15a transmits a transmission signal to the electromagnetic resonance coupler 100. The transmission circuit chip 15a is bonded with the adhesive 16 onto a main surface of the first lead frame 19a. The transmission circuit chip 15a is electrically connected by the wires 18 to the electromagnetic resonance coupler 100.

The reception circuit chip 15b receives a transmission signal from the electromagnetic resonance coupler 100. The reception circuit chip 15b is bonded with the adhesive 16 onto a main surface of the second lead frame 19b. The reception circuit chip 15b is electrically connected by the wires 18 to the electromagnetic resonance coupler 100.

The adhesive 16 is used for bonding the transmission circuit chip 15a to the first lead frame 19a. The adhesive 16 is used for bonding the reception circuit chip 15b to the second lead frame 19b. Although not particularly limited, the adhesive 16 is, for example, a Ag paste or solder.

The mold resin 13 is used for sealing the transmission circuit chip 15a, the reception circuit chip 15b, and the electromagnetic resonance coupler 100. The mold resin 13 protects the transmission circuit chip 15a, the reception circuit chip 15b, and the electromagnetic resonance coupler 100 from external shock and/or from gas such as hydrogen sulfide or sulfur dioxide. Although not particularly limited, the mold resin 13 is, for example, an epoxy resin.

The wires 18 are used for electrically connecting the transmission circuit chip 15a, the reception circuit chip 15b, the electromagnetic resonance coupler 100, the first lead frame 19a, and the second lead frame 19b. Although not particularly limited, the wires 18 are formed of, for example, gold.

According to the above configuration, the electromagnetic resonance coupler 100 is bonded to the first lead frame 19a and the second lead frame 19b. In short, the first lead frame 19a and the second lead frame 19b are supported by the electromagnetic resonance coupler 100. Accordingly, curling of the first lead frame 19a and the second lead frame 19b, caused by packaging stress after sealing with resin, can be suppressed.

Because curling of the first lead frame 19a and the second lead frame 19b is suppressed by the electromagnetic resonance coupler 100, the suspension leads 12 can be eliminated or the number thereof can be reduced. Accordingly, the signal transmission apparatus 10 can be made smaller. The interfacial pealing or resin crack between the mold resin 13 and the suspension leads 12, caused by cutting stress when cutting the suspension leads 12, can be suppressed. Therefore, the reliability such as moisture resistance of the signal transmission apparatus 10 can be improved.

Next, using FIGS. 8A to 9, modifications of the first embodiment will be described.

Figure 8A:
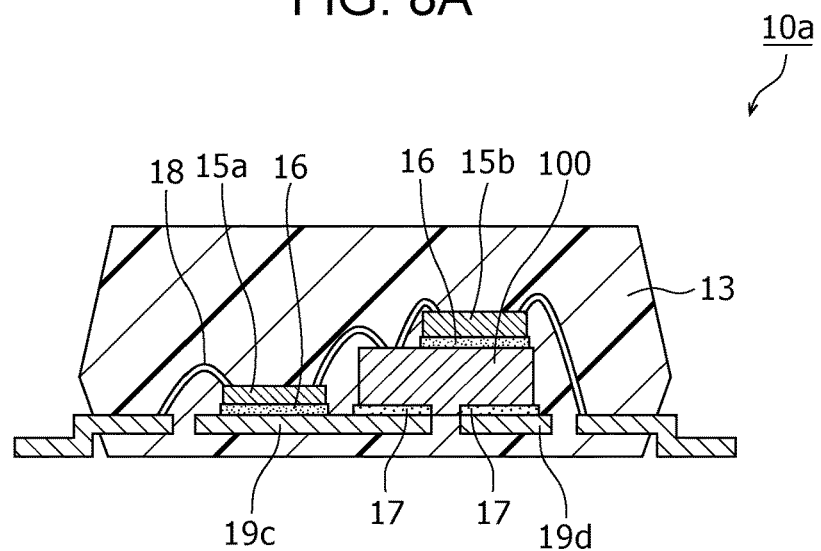
FIG. 8A is a cross-sectional view illustrating a signal transmission apparatus according to a first modification of the first embodiment.
Figure 8B:
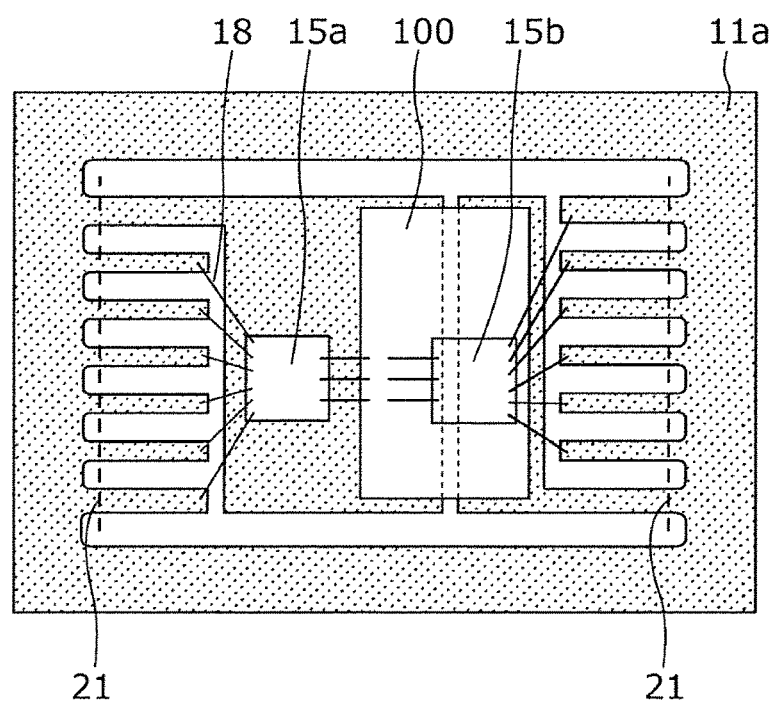
FIG. 8B is a top view illustrating the signal transmission apparatus before being sealed with resin according to the first modification of the first embodiment.

FIG. 8A is a cross-sectional view of a signal transmission apparatus 10a according to a first modification of the first embodiment. The cross section illustrated in FIG. 8A is a cross section corresponding to FIG. 7A. FIG. 8B is a top view illustrating the signal transmission apparatus 10a before being sealed with resin according to the first modification of the first embodiment. Although FIG. 8B is not a cross-sectional view, a lead frame sheet 11a is hatched in order to make the illustration easier to understand.

As illustrated in FIGS. 8A and 8B, the signal transmission apparatus 10a includes a first lead frame 19c, a second lead frame 19d, the transmission circuit chip 15a, the reception circuit chip 15b, and the electromagnetic resonance coupler 100.

The bottom surface of the electromagnetic resonance coupler 100 is bonded with the adhesive 17 to both the first lead frame 19c and the second lead frame 19d. The reception circuit chip 15b is bonded to the top surface of the electromagnetic resonance coupler 100. The electromagnetic resonance coupler 100 is electrically connected by the wires 18 to the transmission circuit chip 15a and the reception circuit chip 15b.

The first lead frame 19c and the leads of the transmission circuit chip 15a are connected by the wires 18. The second lead frame 19d and the leads of the reception circuit chip 15b are connected by the wires 18. The transmission circuit chip 15a is bonded with the adhesive 16 to the first lead frame 19c.

According to the first modification, the area of the second lead frame 19d can be reduced. Therefore, the signal transmission apparatus 10a can be made further smaller. The electromagnetic resonance coupler 100 may be bonded not to the reception circuit chip 15b, but to the transmission circuit chip 15a, or may be bonded to both the transmission circuit chip 15a and the reception circuit chip 15b. Accordingly, the area of at least one of the first lead frame 19c and the second lead frame 19d can be reduced. Therefore, an area necessary for placing the signal transmission apparatus 10a on a circuit substrate or the like can be reduced.

FIG. 9 is a cross-sectional view of a signal transmission apparatus 10b according to a second modification of the first embodiment. The cross section illustrated in FIG. 9 is a cross section corresponding to FIG. 7A. As illustrated in FIG. 9, the electromagnetic resonance coupler 100 of the signal transmission apparatus 10b according to the second modification of the first embodiment includes a first pad 24a and a second pad 24b. The bottom surface of the electromagnetic resonance coupler 100 is covered with a resist layer 117 (see later-described FIG. 12). The first pad 24a and the second pad 24b are formed in openings of the resist layer 117 and are used as a bonding surface of the electromagnetic resonance coupler 100.

The resist layer 117 protects the electromagnetic resonance coupler 100 and is formed of a nonconductive material such as polyimide.

The first pad 24a and the second pad 24b make it easier for the electromagnetic resonance coupler 100 to be bonded respectively to the first lead frame 19a and the second lead frame 19b. It is only necessary for the first pad 24a and the second pad 24b to be formed of metal, and the material is not particularly limited.

The bonding of the electromagnetic resonance coupler 100 to the first lead frame 19a and the second lead frame 19b is metal-to-metal bonding. Therefore, the bonding of the electromagnetic resonance coupler 100 to the first lead frame 19a and the second lead frame 19b can be performed in the same step as the bonding between the transmission circuit chip 15a and the first lead frame 19a and/or the bonding between the reception circuit chip 15b and the second lead frame 19b. Accordingly, the bonding step is simplified. The above-mentioned bonding is performed using, for example, solder or a Ag paste.

As described above, according to the present embodiment, the signal transmission apparatus 10 includes the first lead frame 19a and the second lead frame 19b, which are located with a space therebetween. The signal transmission apparatus 10 includes the transmission circuit chip 15a, which is electrically connected to the first lead frame 19a and which transmits a transmission signal, and the reception circuit chip 15b, which is electrically connected to the second lead frame 19b and which receives the transmission signal. The signal transmission apparatus 10 includes the electromagnetic resonance coupler 100, which contactlessly transmits the transmission signal, transmitted from the transmission circuit chip 15a, to the reception circuit chip 15b. The electromagnetic resonance coupler 100 includes the transmission resonator 105 and the reception resonator 108. The transmission resonator 105 is electrically connected to the transmission circuit chip 15a and contactlessly transmits the transmission signal, transmitted from the transmission circuit chip 15a, to the reception resonator 108. The reception resonator 108 is electrically connected to the reception circuit chip 15b and transmits the contactlessly-transmitted transmission signal to the reception circuit chip 15b. The electromagnetic resonance coupler 100 has a main surface bonded to both the first lead frame 19a and the second lead frame 19b.

Accordingly, the first lead frame 19a and the second lead frame 19b are supported by the electromagnetic resonance coupler 100. Therefore, the first lead frame 19a and the second lead frame 19b are prevented from curling caused by stress before and after resin sealing, even when there are no suspension leads 12. Accordingly, the signal transmission apparatus 10 can dispense with the suspension leads 12 and becomes smaller. Because there becomes no interfacial pealing or resin crack between the mold resin 13 and the suspension leads 12, caused by cutting stress when cutting the suspension leads 12 along the cutting line 21, the reliability such as moisture resistance of the signal transmission apparatus 10 is prevented from deteriorating.

The bonding surface of the electromagnetic resonance coupler 100 may include the first pad 24a for bonding the electromagnetic resonance coupler 100 to the first lead frame 19a and the second pad 24b for bonding the electromagnetic resonance coupler 100 to the second lead frame 19b.

Accordingly, it becomes easier to bond the electromagnetic resonance coupler 100 to the first lead frame 19a and the second lead frame 19b.

The first pad 24a may be formed of metal and may be bonded with the adhesive 17 to the first lead frame 19a. The second pad 24b may be formed of metal and may be bonded with the adhesive 17 to the second lead frame 19b.

Accordingly, the bonding of the electromagnetic resonance coupler 100 to the first lead frame 19a and the second lead frame 19b becomes metal-to-metal bonding. Therefore, the bonding of the electromagnetic resonance coupler 100 to the first lead frame 19a and the second lead frame 19b can be performed in the same step as the bonding between the transmission circuit chip 15a and the first lead frame 19a and/or the bonding between the reception circuit chip 15b and the second lead frame 19b. Accordingly, the bonding step is simplified. The above-mentioned bonding is performed using, for example, solder or a Ag paste.

The transmission circuit chip 15a may be bonded to the first lead frame 19a, and the reception circuit chip 15b may be bonded to the second lead frame 19b. In doing so, the thickness of the signal transmission apparatus 10 becomes thinner, thereby making the signal transmission apparatus 10 smaller.

The transmission circuit chip 15a may be bonded to the first lead frame 19c, and the reception circuit chip 15b may be bonded to the top surface of the electromagnetic resonance coupler 100. In doing so, the area of the second lead frame 19d is reduced, thereby reducing the area necessary for locating the signal transmission apparatus 10 on a circuit substrate or the like.

The transmission circuit chip 15a may be bonded to the top surface of the electromagnetic resonance coupler 100, and the reception circuit chip 15b may be bonded to the second lead frame 19d. In doing so, the area of the first lead frame 19c is reduced, thereby reducing the area necessary for locating the signal transmission apparatus 10 on a circuit substrate or the like.

The signal transmission apparatus 10 may further include the mold resin 13. In this case, the transmission circuit chip 15a, the reception circuit chip 15b, and the electromagnetic resonance coupler 100 may be sealed with the mold resin 13. Because the transmission circuit chip 15a, the reception circuit chip 15b, and the electromagnetic resonance coupler 100 are protected by the mold resin 13, failures become less likely to occur. As a result, the reliability of the signal transmission apparatus 10 becomes higher.

Second Embodiment

Hereinafter, a second embodiment will be described using FIGS. 10A to 14. Note that descriptions that overlap those in the first embodiment will be appropriately omitted.

Figure 10A:
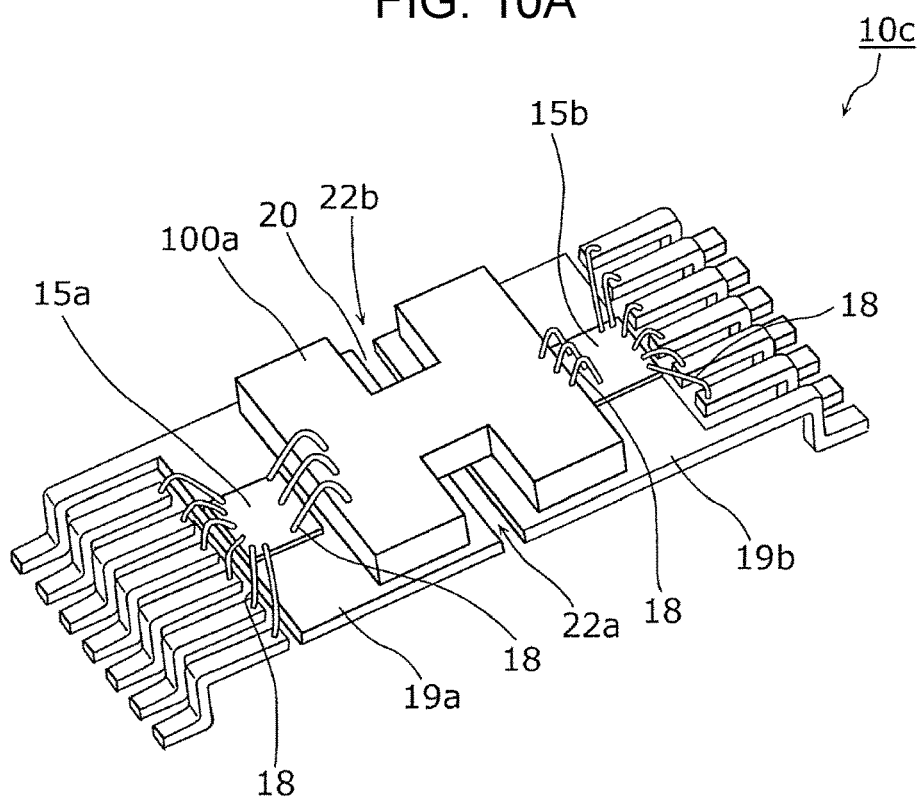
FIG. 10A is a perspective view illustrating the internal configuration of a signal transmission apparatus according to a second embodiment.
Figure 10B:
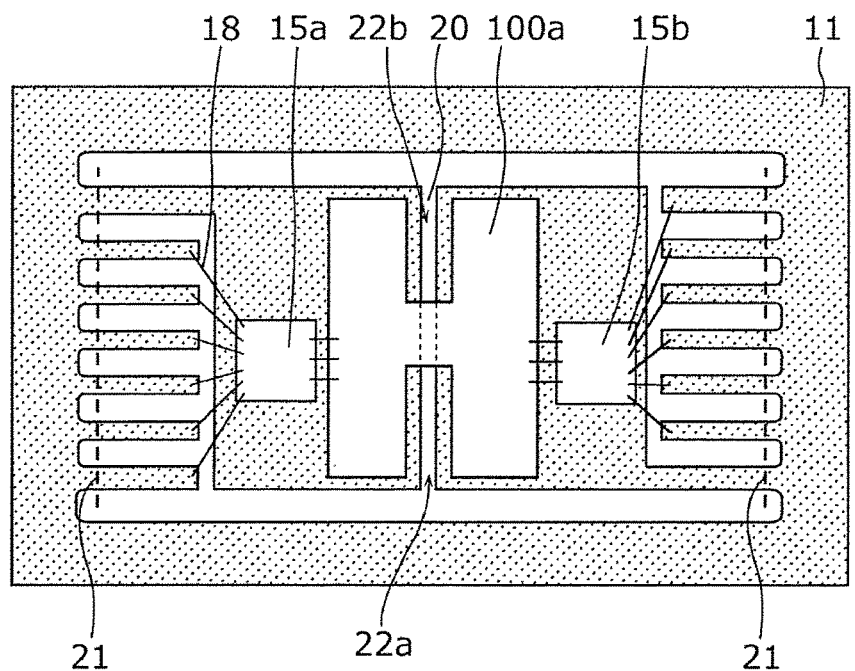
FIG. 10B is a top view illustrating the signal transmission apparatus before being sealed with resin according to the second embodiment.

FIG. 10A is a perspective view illustrating the internal configuration of a signal transmission apparatus 10c according to the second embodiment. FIG. 10B is a top view illustrating the signal transmission apparatus 10c before being sealed with resin according to the second embodiment. Although FIG. 10B does not illustrate the cross section of the lead frame sheet 11, the lead frame sheet 11 is hatched in order to make the illustration easier to understand.

As illustrated in FIGS. 10A and 10B, the signal transmission apparatus 10c according to the second embodiment includes the first lead frame 19a, the second lead frame 19b, the transmission circuit chip 15a, the reception circuit chip 15b, and a electromagnetic resonance coupler 100a. The signal transmission apparatus 10c is sealed with the mold resin 13 to be packaged. The first lead frame 19a and the second lead frame 19b are located with a space 20 therebetween.

The electromagnetic resonance coupler 100a is located on the first lead frame 19a, the second lead frame 19b, and the space 20 between the first lead frame 19a and the second lead frame 19b, and is bonded with the adhesive 17 to the first lead frame 19a and the second lead frame 19b. The electromagnetic resonance coupler 100a is electrically connected by the wires 18 to the transmission circuit chip 15a and the reception circuit chip 15b.

The transmission circuit chip 15a is bonded with the adhesive 16 to the first lead frame 19a. The transmission circuit chip 15a is electrically connected by the wires 18 to the leads of the first lead frame 19a.

The reception circuit chip 15b is bonded with the adhesive 16 to the second lead frame 19b. The reception circuit chip 15b is electrically connected by the wires 18 to the leads of the second lead frame 19b.

In the second embodiment, the electromagnetic resonance coupler 100a has a first recess 22a in a first side surface of the electromagnetic resonance coupler 100a, and a second recess 22b in a second side surface opposite to the first side surface. The first recess 22a and the second recess 22b are positioned above the space 20 so as to penetrate through the electromagnetic resonance coupler 100a and lead to the space 20.

According to the configuration, a portion under each lead frame can be filled with the mold resin 13 through the first recess 22a and the second recess 22b, which are positioned above the space 20 between the first lead frame 19a and the second lead frame 19b. Accordingly, the isolation of the signal transmission apparatus 10c is prevented from deteriorating, and the mold resin 13 at an end portion of the first lead frame 19a and of the second lead frame 19b is prevented from pealing off.

Note that the shape of the electromagnetic resonance coupler 100a is only exemplary. Like the first recess 22a or the second recess 22b, one or more recesses may be formed. Alternatively, instead of recesses, a through hole (not illustrated) that penetrates through the electromagnetic resonance coupler 100a from top to bottom may be provided. The first recess 22a, the second recess 22b, and the through hole (not illustrated) are examples of a "notch" of the present disclosure. It is only necessary for the notch to be formed to suppress insufficiency in filling a portion under each lead frame with the mold resin 13, and the shape of the notch is not limited.

For example, the mold resin 13 includes an upper area that covers the top surface of the electromagnetic resonance coupler 100a, a lower area that covers the bottom surface of the electromagnetic resonance coupler 100a, and an area that goes through the notch and connect the upper area and the lower area. The lower area fills, for example, the space 20 between the first lead frame 19a and the second lead frame 19b.

Figure 11:
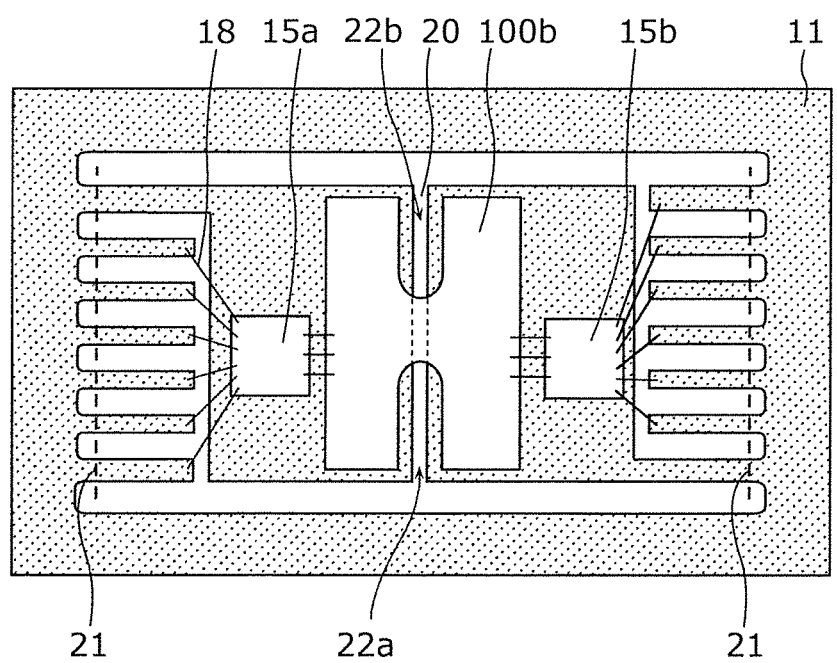
FIG. 11 is a top view illustrating a signal transmission apparatus before being sealed with resin according to a modification of the second embodiment.

Hereinafter, a signal transmission apparatus including an electromagnetic resonance coupler whose shape is different from that of the electromagnetic resonance coupler 100a will be described as a signal transmission apparatus before being sealed with resin according to a modification of the second embodiment. FIG. 11 is a top view illustrating a signal transmission apparatus before being sealed with resin according to a modification of the second embodiment. Although FIG. 11 is not a cross-sectional view, the lead frame sheet 11 is hatched in order to make the illustration easier to understand.

As illustrated in FIG. 11, the first recess 22a and the second recess 22b are partially curved and have no corners. As illustrated in FIG. 11, the cross-sectional shape of the first recess 22a and the second recess 22b, cut along a plane parallel to the main surface of an electromagnetic resonance coupler 100b, is U-shaped. Alternatively, the cross-sectional shape of the first recess 22a and the second recess 22b may be arc-shaped. Accordingly, insufficiency in filling with the mold resin 13 is effectively suppressed, and reliability deterioration such as pealing caused by insufficient filling with the mold resin 13 is effectively suppressed.

Hereinafter, the electromagnetic resonance coupler 100a will be described using FIGS. 12 to 14.

Figure 12:
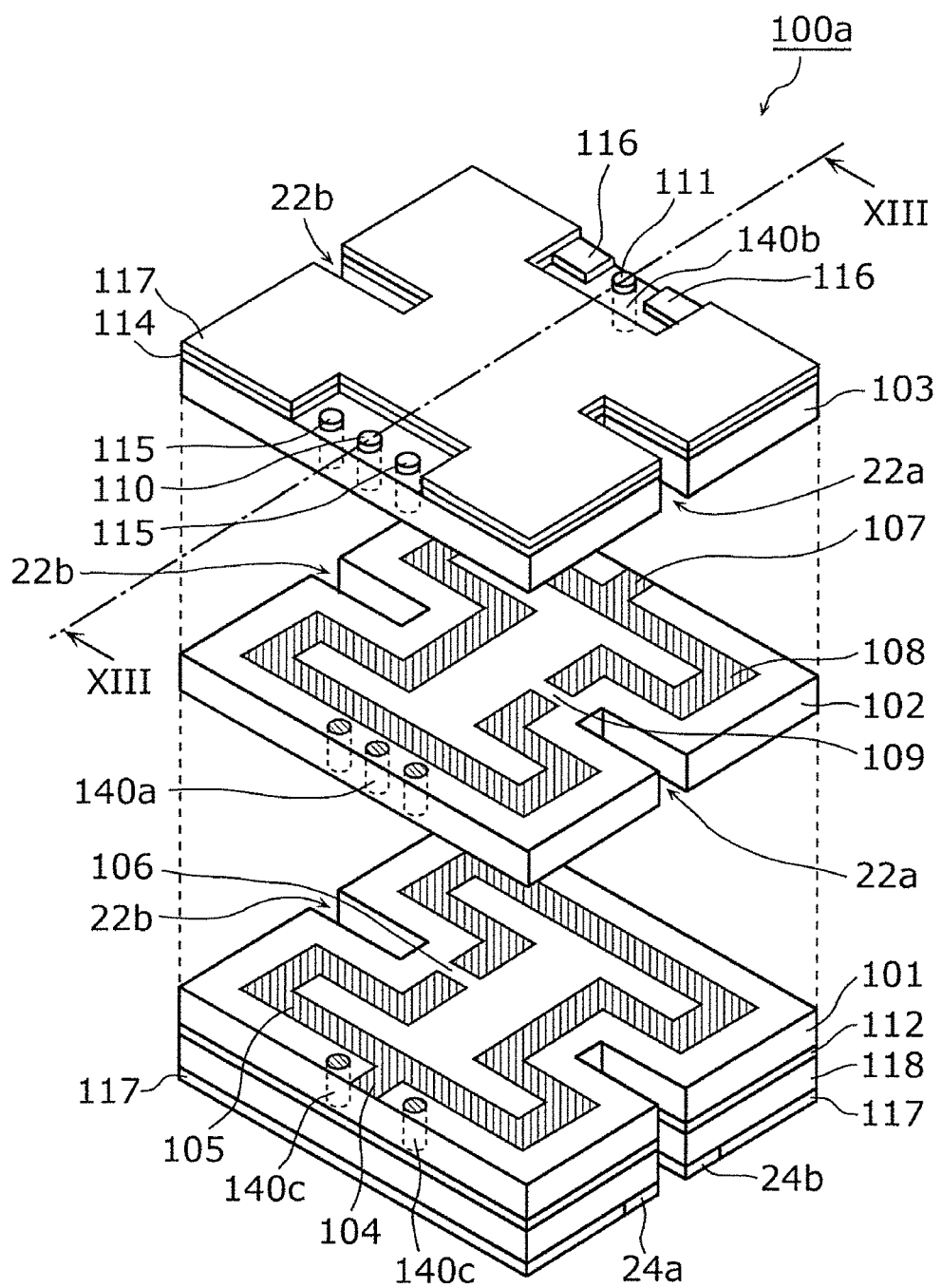
FIG. 12 is an exploded perspective view illustrating an electromagnetic resonance coupler according to the second embodiment.
Figure 13:
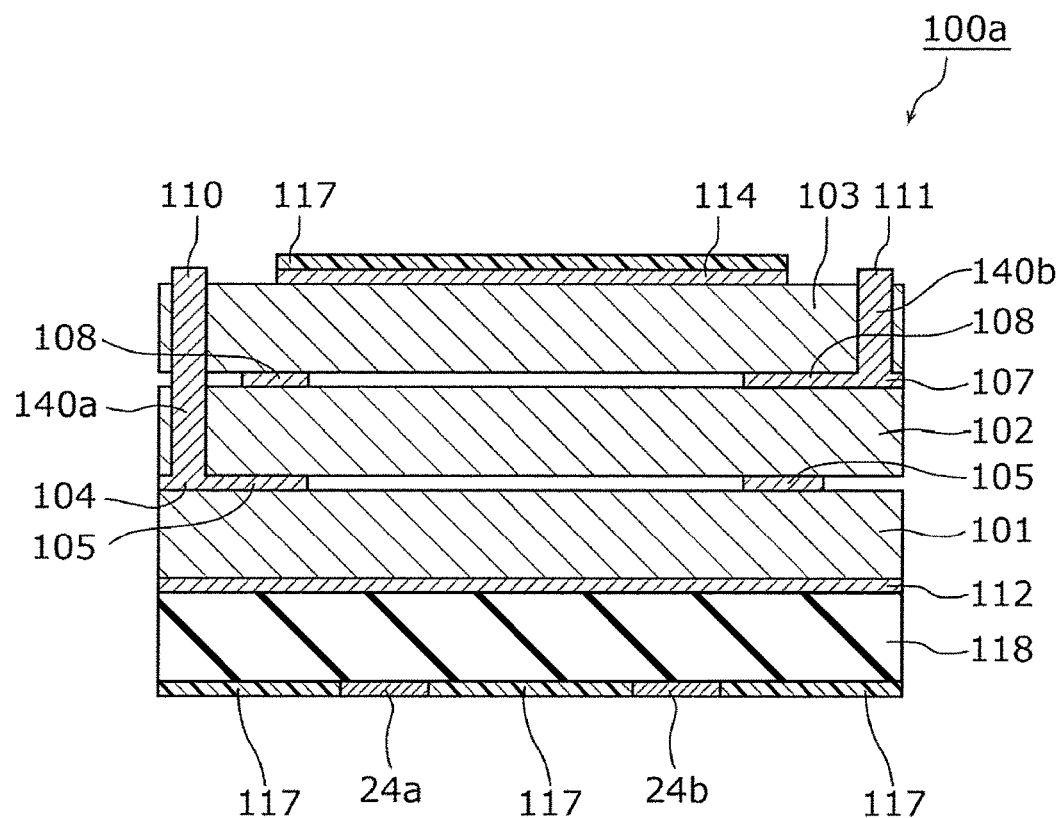
FIG. 13 is a cross-sectional view illustrating the electromagnetic resonance coupler cut along broken line XIII-XIII of FIG. 12.

FIG. 12 is an exploded perspective view illustrating the electromagnetic resonance coupler 100a according to the second embodiment. FIG. 13 is a cross-sectional view of the electromagnetic resonance coupler 100a cut along broken line XIII-XIII of FIG. 12. Although FIG. 12 does not illustrate the cross section of transmission wiring 104, the transmission resonator 105, reception wiring 107, and the reception resonator 108, these elements are hatched in order to make the illustration easier to understand.

As illustrated in FIG. 12, the electromagnetic resonance coupler 100a includes a transmission substrate 101, a reception substrate 102 located on the transmission substrate 101, and a cap substrate 103 located on the reception substrate 102. A rear ground 112 is located under the transmission substrate 101. An insulation layer 118 is located under the rear ground 112. The resist layer 117, the first pad 24a, and the second pad 24b are located under the insulation layer 118. The first pad 24a and the second pad 24b are located in the openings in the resist layer 117. A cap ground 114 is located on the cap substrate 103. The resist layer 117 is located on the cap ground 114.

Here, a specific example of a process of forming the first pad 24a and the second pad 24b will be described. At first, the insulation layer 118 is formed under the rear ground 112. Next, a metal layer is formed under the insulation layer 118. By etching the formed metal layer, a metal layer that will become the first pad 24a and the second pad 24b is formed. Furthermore, the resist layer 117 is applied to the bottom surface of the metal layer and the insulation layer 118, and then the resist layer 117 is etched. By this etching, openings are formed such that the metal layer, which will become the first pad 24a and the second pad 24b, is exposed from the resist layer 117. In doing so, the resist layer 117, the first pad 24a, and the second pad 24b are formed under the insulation layer 118. Although the shape of the first pad 24a and the second pad 24b is different in FIGS. 12 and 9, the first pad 24a and the second pad 24b are not limited to these shapes. The bottom surface of the first pad 24a and the second pad 24b may be formed to be flush with the bottom surface of the resist layer 117, or to be positioned below the bottom surface of the resist layer 117. In either case, the bottom surface of the first pad 24a and the second pad 24b configures the bottom surface (that is, first main surface) of the electromagnetic resonance coupler 100a.

The transmission substrate 101 includes the transmission wiring 104 and the transmission resonator 105, and the transmission resonator 105 includes a slit 106. The transmission wiring 104 and the transmission resonator 105 are located on the top surface of the transmission substrate 101. A first end of the transmission wiring 104 is electrically connected to the transmission resonator 105. A connection part between the first end of the transmission wiring 104 and the transmission resonator 105 is located at a position corresponding to a length that is one fourth of the wiring length of the transmission resonator 105 from the first end of the transmission resonator 105. A second end of the transmission wiring 104 is connected to an input terminal 110 through a via 140a. The input terminal 110 is electrically connected to the transmission circuit chip 15a. It is only necessary for the transmission wiring 104 and the transmission resonator 105 to be formed of metal, and the material is not particularly limited; for example, the transmission wiring 104 and the transmission resonator 105 are formed of gold.

The transmission substrate 101 has the first recess 22a and the second recess 22b. The wiring of the reception resonator 108 is located along with at least one of the first recess 22a and the second recess 22b.

The transmission substrate 101 contactlessly transmits a transmission signal, transmitted from the transmission circuit chip 15a, to the reception substrate 102. The contactlessly-transmitted transmission signal is input from the reception substrate 102 to the reception circuit chip 15b.

The reception substrate 102 includes the reception wiring 107 and the reception resonator 108, and the reception resonator 108 includes a slit 109. The reception wiring 107 and the reception resonator 108 are located on the top surface of the reception substrate 102. A first end of the reception wiring 107 is electrically connected to the reception resonator 108. A connection part between the first end of the reception wiring 107 and the reception resonator 108 is located at a position corresponding to a length that is one fourth of the wiring length of the reception resonator 108 from the first end of the reception resonator 108. A second end of the reception wiring 107 is connected to an output terminal 111 through a via 140b. The output terminal 111 is electrically connected to the reception circuit chip 15b. It is only necessary for the reception wiring 107 and the reception resonator 108 to be formed of metal, and the material is not particularly limited; for example, the reception wiring 107 and the reception resonator 108 are formed of gold.

The reception substrate 102 has the first recess 22a and the second recess 22b. The wiring of the reception resonator 108 is located along with at least one of the first recess 22a and the second recess 22b.

The cap substrate 103 protects the reception wiring 107 and the reception resonator 108. The cap ground 114 is formed on the top surface of the cap substrate 103 so as to cover the top surface of the cap substrate 103. The cap ground 114 is not formed on portions of the top surface of the cap substrate 103, and the input terminal 110, the output terminal 111, and transmission ground terminals 115 are formed in these portions. The cap substrate 103 has the first recess 22a and the second recess 22b.

The material of the transmission substrate 101, the reception substrate 102, and the cap substrate 103 is not particularly limited; for example, the material may be dielectric. The material of the transmission substrate 101, the reception substrate 102, and the cap substrate 103 may be, for example, sapphire. The material of the transmission substrate 101, the reception substrate 102, and the cap substrate 103 may be, for example, silicon semiconductor.

The rear ground 112 is wiring that represents a reference potential of a transmission signal transmitted by the transmission substrate 101. The rear ground 112 is connected to the transmission ground terminals 115 of the cap substrate 103 through vias 140c. The rear ground 112 is formed of, for example, metal; however, the material is not particularly limited. The rear ground 112 is formed of, for example, copper. The via 140a, the via 140b, and the vias 140c are formed of, for example, copper; however, these vias 140a, 140b, and 140c may be formed of other metals, and the material is not particularly limited.

The cap ground 114 is wiring that represents a reference potential of a transmission signal transmitted by the reception substrate 102. Although the top surface of the cap ground 114 is covered with the resist layer 117, part of the top surface is not covered. Portions of the top surface of the cap ground 114 not covered with the resist layer 117 are used as reception ground terminals 116. It is only necessary that the cap ground 114 be formed of metal, and the material is not particularly limited. For example, the cap ground 114 is formed of copper.

The resist layer 117 is a nonconductive material that protects the upper side and the lower side of the electromagnetic resonance coupler 100a. The resist layer 117 is formed of, for example, polyimide; however, the material is not particularly limited.

The first pad 24a and the second pad 24b make it easier for the electromagnetic resonance coupler 100a to be bonded to the first lead frame 19a and the second lead frame 19b. It is only necessary for the first pad 24a and the second pad 24b to be formed of metal, and the material is not limited to a particular material.

The insulation layer 118 is a nonconductive material used for isolating the electromagnetic resonance coupler 100a from the first lead frame 19a and the second lead frame 19b. The material of the insulation layer 118 may be the same as, for example, that of the transmission substrate 101, the reception substrate 102, and/or the cap substrate 103, and is not particularly limited. The material of the insulation layer 118 may be, for example, dielectric, sapphire, or silicon semiconductor; the material is not particularly limited.

Next, the transmission resonator 105 and the reception resonator 108 will be described. The wiring shape of the transmission resonator 105 is the same as that of the reception resonator 108, and their sizes are also the same. The transmission resonator 105 and the reception resonator 108 are located on the transmission substrate 101 and the reception substrate 102 such that, when viewed from a direction perpendicular to the main surface of the transmission substrate 101, the outline of the transmission resonator 105 and the outline of the reception resonator 108 match except for the transmission wiring 104, the reception wiring 107, the slit 106, and the slit 109. The fact that the outlines match is not limited to the fact that the outlines perfectly match, and includes the fact that the outlines match when misalignment caused by manufacturing placement errors is ignored. The main surface of the transmission substrate 101 is a surface on which the transmission resonator 105 and the transmission wiring 104 on the transmission substrate 101 are provided.

When viewed from a direction perpendicular to the main surface of the transmission substrate 101, the transmission resonator 105 and the reception resonator 108 are located such that the shape of the transmission resonator 105 and the shape of the reception resonator 108 are symmetric about a point.

Next, the shape of the transmission resonator 105 will be described. Since the shape and size of the reception resonator 108 are the same as those of the transmission resonator 105, a description thereof is omitted.

The transmission resonator 105 includes open-loop-shaped wiring that is partially open in the slit 106. This wiring has two concave portions folded toward the inside of an area surrounded by this wiring. One of the two concave portions is provided with the slit 106.

The transmission resonator 105 has a line-symmetrical shape with respect to a straight line that passes through the transmission wiring 104, except for the slit 106. The transmission wiring 104 has a line-symmetrical shape with respect to a straight line that passes through the slit 106. The transmission resonator 105 has a point-symmetrical shape with respect to the center point of an area surrounded by the transmission resonator 105, except for the slit 106.

The wiring of each of the transmission resonator 105 and the reception resonator 108 extends along with at least one of the first recess 22a and the second recess 22b. In FIG. 12, the wiring of each of the transmission resonator 105 and the reception resonator 108 has two concave portions folded inward, along with the first recess 22a and the second recess 22b. Accordingly, a portion under each lead frame is filled with the mold resin 13 through the first recess 22a and the second recess 22b of the electromagnetic resonance coupler 100a, and it becomes possible to establish electromagnetic resonance coupling between the transmission resonator 105 and the reception resonator 108.

The distance between the transmission resonator 105 and the reception resonator 108 in a direction perpendicular to the main surface of the transmission substrate 101 may be less than or equal to about the wavelength of a transmission signal transmitted by the electromagnetic resonance coupler 100a. Accordingly, the electromagnetic resonance coupling between the transmission resonator 105 and the reception resonator 108 becomes strong. For example, the distance between the transmission resonator 105 and the reception resonator 108 in a direction perpendicular to the main surface of the transmission substrate 101 may be designed to be less than or equal to half the wavelength of the transmitted transmission signal. Specifically, the thickness of the reception substrate 102 is designed to be less than or equal to half the wavelength of the transmitted transmission signal.

Here, the wavelength of the transmission signal is a wavelength that takes into consideration the fractional shortening (FS) of the wavelength in accordance with the material of wiring through which the signal is transmitted, and the wavelength FS in accordance with dielectric between the transmission resonator 105 and the reception resonator 108. In the second embodiment, the above-described wavelength FS is defined in accordance with gold, which is the material of the wiring, and sapphire, which is the material of the substrates.

Hereinafter, the transmission resonator 105 of the electromagnetic resonance coupler 100a according to the second embodiment will be described in further detail. Since the wiring shape and size of the transmission resonator 105 are the same as those of the reception resonator 108, a description of the reception resonator 108 will be omitted, and the transmission resonator 105 will be described in detail.

When the resonator is an LC resonator, its resonance frequency is determined by its inductance (L) and capacitance (C). In short, the greater the inductance component and the capacitance component of the resonator become, the lower the resonant frequency of the resonator becomes.

When the resonator is an open-ring-type electromagnetic resonance coupler, its inductance is determined by the wiring of the resonator, and its capacitance is determined by a slit provided and cut in the wiring of the resonator.

When the resonator is an open-ring-type electromagnetic resonance coupler, its inductance component or capacitance component can be increased by concentrating the electromagnetic field between two resonators that overlap each other. Specifically, for example, when the electromagnetic field around the slit is strengthened, the capacitance component of the resonator can be increased.

In the electromagnetic resonance coupler 100a, the wiring is densified around the slit 106, thereby strengthening the electromagnetic field around the slit 106 and increasing the capacitance component of the transmission resonator 105. In doing so, the operating frequency of the electromagnetic resonance coupler 100a is lowered.

In the electromagnetic resonance coupler 100a, the wiring of the transmission resonator 105 is folded around the slit 106, thereby increasing the wiring density around the slit 106. In doing so, the electromagnetic field around the slit 106 is strengthened, and the capacitance component of the transmission resonator 105 is increased. As a result, the operating frequency of the electromagnetic resonance coupler 100a can be lowered.

Figure 14:
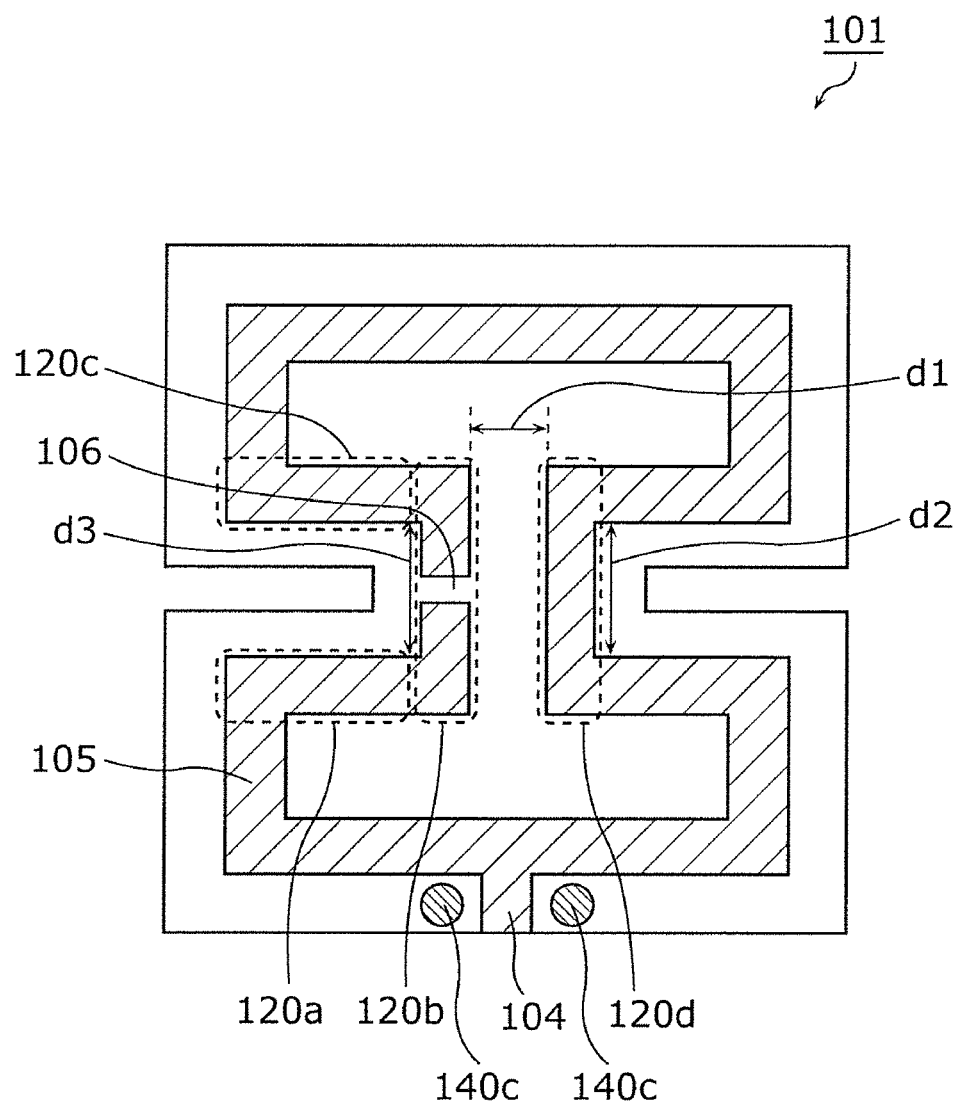
FIG. 14 is a top view illustrating a transmission substrate according to the second embodiment.

FIG. 14 is a top view of the transmission substrate according to the second embodiment. A first wiring portion 120b is a portion of the transmission resonator 105 that includes two end portions facing each other across the slit 106. A second wiring portion 120d is a portion of the transmission resonator 105 that faces the first wiring portion 120b in a direction perpendicular to a direction in which the two end portions face each other. A third wiring portion 120a is a portion of the transmission resonator 105 that extends from a first end portion of the first wiring portion 120b in a direction different from the first wiring portion 120b. A fourth wiring portion 120c is a portion of the transmission resonator 105 that extends from a second end portion of the first wiring portion 120b in a direction different from the first wiring portion 120b. According to FIGS. 14 and 12, the first wiring portion 120b corresponds to a portion of the transmission resonator 105 that extends along the bottom of the second recess 22b, and the second wiring portion 120d corresponds to a portion of the transmission resonator 105 that extends along the bottom of the first recess 22a. The third wiring portion 120a corresponds to a portion of the transmission resonator 105 that extends along a first side wall of the second recess 22b, and the fourth wiring portion 120c corresponds to a portion of the transmission resonator 105 that extends along a second side wide wall of the second recess 22b. At this time, the space d1 between the first wiring portion 120b and the second wiring portion 120d and the space d3 between the third wiring portion 120a and the fourth wiring portion 120c may be designed as follows.

The electromagnetic field of RF waves propagating through wiring propagates more widely than the width of the wiring. The spread of the electromagnetic field is determined by the wiring confinement level, and the electromagnetic field spreads up to four times the width of the wiring. Therefore, to strengthen the electromagnetic field, the space d1 and/or the space d3 may be designed to be less than or equal to four times the width of the wiring. The same applies to the space d2 between a pair of wiring portions that extend from two ends of the second wiring portion 120d, although a description thereof will be omitted.

As described above, densifying the wiring around the slit 106 to concentrate the electromagnetic field is equivalent to increasing the capacitance component of the transmission resonator 105. Keeping the wires forming the transmission resonator 105 close to each other to concentrate the electromagnetic field is equivalent to increasing the inductance component of the transmission resonator 105. In short, the operating frequency is determined by the spaces d1 to d3 and the width of the wiring. Thus, the operating frequency of the electromagnetic resonance coupler 100a can be lowered by providing concave portions in the transmission resonator 105. When the wiring of the transmission resonator 105 has two concave portions folded inward, the length of wiring contained per unit area can be increased. This can further lower the operating frequency of the electromagnetic resonance coupler 100a.

One of the two concave portions includes the slit 106. The slit 106 is provided near the center of an area surrounded by the wiring forming the transmission resonator 105. The transmission resonator 105 has a shape that keeps the wiring in another portion forming the transmission resonator 105 close to two wiring ends that face each other as a result of cutting by the slit 106. Therefore, the transmission resonator 105 has a greater capacitance component and a greater inductance component.

In the wiring of the transmission resonator 105, the outline of a portion excluding portions constituting the concave portions is not particularly limited; the portion may have, for example, a bracket shape, an angle bracket shape, or a round bracket shape.

In the wiring of the transmission resonator 105, the outline of portions constituting the concave portions is not limited to a bracket shape illustrated in FIGS. 12 and 14; the portions may have, for example, an angle bracket shape or a round bracket shape.

The wiring constituting the concave portions of the transmission resonator 105 may be bent along the first recess 22a and the second recess 22b. To strengthen the electromagnetic resonance coupling, the resonator may be wired so as to have the above-mentioned dimensions, and the first recess 22a and the second recess 22b may be formed along the concave portions. In doing so, it becomes easier for a portion under each lead frame to be filled with the mold resin 13 through the first recess 22a and the second recess 22b of the electromagnetic resonance coupler 100. Because the wiring of the transmission resonator 105 is arranged along the first recess 22a and the second recess 22b, two concave portions are provided in the transmission resonator 105 in accordance with the shape of the electromagnetic resonance coupler 100a. Note that it is only necessary for the transmission resonator 105 to have at least one concave portion, and it is not essential for the transmission resonator 105 to have two concave portions.

Although the signal transmission apparatus according to one or more aspects has been described on the basis of the embodiments, the present disclosure is not limited to the embodiments. The one or more aspects of the present disclosure may include an embodiment obtained by adding various modifications conceivable by those skilled in the art to the embodiments or an embodiment constructed by combining elements in different embodiments without departing from the scope of the present disclosure.

Other Embodiments

The first and second embodiments have been described above as exemplary technology of the present disclosure. However, the technology of the present disclosure is not limited to that described above and is applicable to an embodiment obtained by appropriately changing, replacing, adding, or omitting elements. A new embodiment can be obtained by combining elements described in the first and second embodiments.

Other embodiments will be described by way of example below.

In the second embodiment, the electromagnetic resonance coupler 100a includes the rear ground 112 or the cap ground 114 in order to set the reference potential of the transmission circuit chip 15a or the reception circuit chip 15b. However, the transmission substrate 101 may include a coplanar ground (not illustrated) in order to set the reference potential of the transmission circuit chip 15a. For example, the coplanar ground (not illustrated) may be provided at a position that is on the transmission substrate 101 and that is distant by a certain distance from the transmission wiring 104, the transmission resonator 105, and an area surrounded by these elements. The transmission substrate 101 may have a microstrip line structure or a grounded coplanar line structure. Furthermore, the coplanar ground formed around the transmission wiring 104 and the transmission resonator 105 and the rear ground 112 may be electrically connected through a via. Accordingly, the electromagnetic resonance coupler has a higher efficiency in transmitting transmission signals.

Similarly, the reception substrate 102 may include a coplanar ground (not illustrated). For example, the coplanar ground (not illustrated) may be provided at a position that is on the reception substrate 102 and that is distant by a certain distance from the reception wiring 107, the reception resonator 108, and an area surrounded by these elements. Furthermore, the coplanar ground formed around the reception wiring 107 and the reception resonator 108 and the cap ground 114 may be electrically connected through a via. Accordingly, the electromagnetic resonance coupler has a higher efficiency in transmitting transmission signals. The reception substrate 102 may have a grounded coplanar line structure.

Although the transmission resonator 105 has a line-symmetrical shape in the second embodiment, the shape of the transmission resonator 105 is not limited to this line-symmetrical shape. The transmission resonator 105 may have the same or similar functions even when the transmission resonator 105 does not have a line-symmetrical shape.

What is claimed is:
1. A signal transmission apparatus comprising:
a first lead frame;
a second lead frame spaced apart from the first lead frame;
a primary semiconductor chip electrically connected to the first lead frame;
a secondary semiconductor chip electrically connected to the second lead frame; and
a signal isolator through which a signal is isolatedly transmitted from the primary semiconductor chip to the secondary semiconductor chip, the signal isolator including a first pad located on and bonded to the first lead frame and a second pad located on and bonded to the second lead frame,
wherein the first pad and the second pad are arranged in a same plane and spaced apart from one another,
the signal isolator includes a multilayer substrate having a first notch in plan view, and
the first notch is disposed over a space between the first lead frame and the second lead frame and the first notch extends completely through the multilayer substrate.
2. The signal transmission apparatus according to claim 1, wherein:
the first lead frame includes a first base and first leads,
the second lead frame includes a second base and second leads,
the primary semiconductor chip is electrically connected to the first leads,
the secondary semiconductor chip is electrically connected to the second leads,
the first pad is located on and bonded to the first base, and
the second pad is located on and bonded to the second base.

3. The signal transmission apparatus according to claim 1, wherein:
the first pad is made of metal and is bonded with an adhesive to the first lead frame, and
the second pad is made of metal and is bonded with an adhesive to the second lead frame.

4. The signal transmission apparatus according to claim 1, wherein the signal isolator is an electromagnetic resonance coupler.

5. The signal transmission apparatus according to claim 4, wherein:
the primary semiconductor chip includes a transmission circuit, and
the secondary semiconductor chip includes a reception circuit.

6. The signal transmission apparatus according to claim 1, wherein:
the signal isolator further includes a transmission resonator disposed on a first layer of the multilayer substrate and electrically connected to the primary semiconductor chip, and a reception resonator disposed on a second layer of the multilayer substrate and electrically connected to the secondary semiconductor chip, and
the transmission resonator and the reception resonator each include wiring bent along the first notch in plan view.

7. The signal transmission apparatus according to claim 6, wherein:
the multilayer substrate further has a second notch at a position opposite to the first notch in plan view,
the second notch is disposed over the space, and
the wiring of each of the transmission resonator and the reception resonator is further bent along the second notch in plan view.

8. The signal transmission apparatus according to claim 7, wherein either one or both of the first notch and the second notch has a U-shape or an arc-shape in plan view.

9. The signal transmission apparatus according to claim 1, wherein:
the primary semiconductor chip is located on and bonded to the first lead frame, and
the secondary semiconductor chip is located on and bonded to the second lead frame.

10. The signal transmission apparatus according to claim 1, wherein:
the primary semiconductor chip is located on and bonded to the first lead frame, and
the secondary semiconductor chip is stacked on and bonded to the signal isolator.

11. The signal transmission apparatus according to claim 1, wherein:
the primary semiconductor chip is stacked on and bonded to the signal isolator, and
the secondary semiconductor chip is located on and bonded to the second lead frame.

12. The signal transmission apparatus according to claim 1, further comprising:
mold resin that seals the primary semiconductor chip, the secondary semiconductor chip, and the signal isolator.

13. The signal transmission apparatus according to claim 1, wherein the signal isolator is thicker than the primary semiconductor chip and the secondary semiconductor chip.

14. The signal transmission apparatus according to claim 2, wherein the first base, the second base, respective parts of the first leads, and respective parts of the second leads are located in a same plane.

15. A signal transmission apparatus comprising:
a first lead frame;
a second lead frame spaced apart from the first lead frame;
a primary semiconductor chip electrically connected to the first lead frame;
a secondary semiconductor chip electrically connected to the second lead frame;
a signal isolator through which a signal is isolatedly transmitted from the primary semiconductor chip to the secondary semiconductor chip, the signal isolator including a first pad located on and bonded to the first lead frame and a second pad located on and bonded to the second lead frame, the first pad and the second pad are arranged in a same plane and spaced apart from one another; and
mold resin that seals the primary semiconductor chip, the secondary semiconductor chip, and the signal isolator, wherein:
the signal isolator includes a multilayer substrate having at least one notch in plan view, the at least one notch extends completely through the multilayer substrate, and the mold resin fully fills the at least one notch.

16. A signal transmission apparatus comprising:
a first lead frame;
a second lead frame spaced apart from the first lead frame;
a primary semiconductor chip electrically connected to the first lead frame;
a secondary semiconductor chip electrically connected to the second lead frame;
a signal isolator through which a signal is isolatedly transmitted from the primary semiconductor chip to the secondary semiconductor chip, the signal isolator including a first pad located on and bonded to the first lead frame and a second pad located on and bonded to the second lead frame, the first pad and the second pad are arranged in a same plane and spaced apart from one another; and
mold resin that seals the primary semiconductor chip, the secondary semiconductor chip, and the signal isolator, wherein:
the first lead frame includes a first base and first leads,
the second lead frame includes a second base and second leads,
the primary semiconductor chip is electrically connected to the first leads,
the secondary semiconductor chip is electrically connected to the second leads,
the first pad is located on and bonded to the first base,
the second pad is located on and bonded to the second base,
the first base has a first upper surface and a first bottom surface,
the second base has a second upper surface and a second bottom surface,
the signal isolator includes a multilayer substrate having at least one notch, the at least one notch extends completely through the multilayer substrate, and
the mold resin is provided on the first upper surface, the first bottom surface, the second upper surface and the second bottom surface, and fully fills the at least one notch.

* * * * *